United States Patent [19]

Gochermann

[11] Patent Number: 4,717,790
[45] Date of Patent: Jan. 5, 1988

[54] CONTOURED SOLAR GENERATOR

[75] Inventor: Hans Gochermann, Holm, Fed. Rep. of Germany

[73] Assignee: Licentia Patent-Verwaltungs-GmbH, Frankfurt am Main, Fed. Rep. of Germany

[21] Appl. No.: 925,179

[22] Filed: Oct. 31, 1986

[30] Foreign Application Priority Data

Nov. 2, 1985 [DE] Fed. Rep. of Germany ....... 3538986

[51] Int. Cl.⁴ .............................................. H01L 25/02
[52] U.S. Cl. ..................................... 136/251; 136/291; 156/212; 156/214; 156/285; 156/299; 437/2; 437/209
[58] Field of Search ................... 136/251, 291; 29/581, 29/588, 572; 156/212, 214, 285, 299

[56] References Cited

U.S. PATENT DOCUMENTS

| 3,565,719 | 2/1971 | Webb | 156/212 |
| 4,571,446 | 2/1986 | Yamazaki | 136/244 |
| 4,625,070 | 11/1986 | Berman et al. | 136/249 |
| 4,642,413 | 2/1987 | Ovshinsky | 136/249 |

FOREIGN PATENT DOCUMENTS

| 58-50782 | 3/1983 | Japan | 136/291 |
| 60-220977 | 11/1985 | Japan | 136/291 |
| 60-260164 | 12/1985 | Japan | 136/251 |

*Primary Examiner*—Aaron Weisstuch
*Attorney, Agent, or Firm*—Spencer & Frank

[57] ABSTRACT

A contoured solar generator whose solar cells and their associated electrical terminals and connecting lines are embedded in a laminate including at least the solar cells, an elastic thermosetting adhesive foil and a glass pane. To adapt the solar generator to a given external contour or to fit it into a given contour, the solar generator is configured as a curved laminate including at least one-dimensionally bent solar cells.

17 Claims, 3 Drawing Figures

A-A

A-A

CONTOURED SOLAR GENERATOR

BACKGROUND OF THE INVENTION

1. Field of the Invention

The present invention relates to a contoured solar generator whose solar cells, together with associated electrical terminals and connecting lines, are embedded in a laminate composed of a substrate, an elastic thermosetting adhesive film and a glass plate.

2. Technology Review

Solar generators are generally known for terrestrial applications. They are installed on sailboats, motor yachts or the like in which the solar generators are components of a maintenance-free charging system for on-board batteries. It is also known to equip automobiles with solar generators. In the future, solar generators will be used more frequently in automobile construction, initially to supply, for example, additional fans. These additional fans are able to run, in particular, if the vehicle is standing still and thus protect the vehicle against excessive overheating. It is also possible to charge the vehicle battery by means of solar generators, with these batteries being utilized, for example, to drive the vehicle by means of electric motors (solar automobile).

SUMMARY OF THE INVENTION

The present invention makes it possible, in an advantageous manner, to dispose a solar generator also at contoured surfaces of an automobile, a mobile home, or a boat where such surfaces are in the most flow enhancing location or to integrate the solar cell in the vehicle at these surfaces. Advantageously, it is also assured that already existing vehicles can be retrofitted.

It is an object of the invention to provide a solar generator of the above-mentioned type which can be adapted to a given external contour or can be fitted into such a contour.

This object is accomplished by the invention in that the solar generator is configured as a curved laminate equipped with at least one-dimensionally bent solar cells.

The drawing figures illustrate one embodiment of the invention.

DETAILED DESCRIPTION OF THE INVENTION

Figure 1:
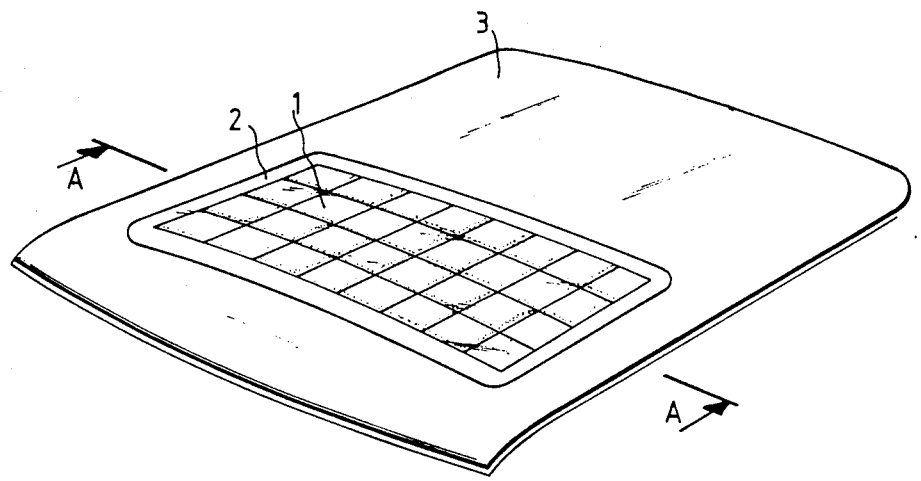
FIG. 1 shows a solar generator in use as the sun roof of a passenger automobile.
Figure 2:
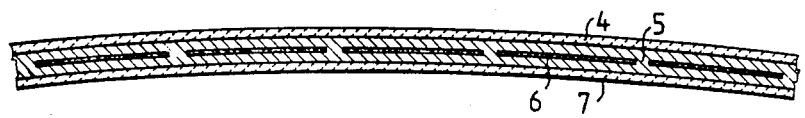
FIG. 2 is a sectional view along line A—A of FIG. 1.

In FIG. 1, the roof 3 of a vehicle is provided with a sun roof 2 in which a solar generator 1 is integrated. The solar generator is designed as a curved laminate of some one-dimensionally bent solar cells and some two-dimensionally bent solar cells. It includes a substrate 7 and a glass pane 4 which are thermally preformed and manufactured in pairs between which an elastic thermosetting adhesive foil 5 and the bent solar cells 6 are arranged (see FIG. 2). A glass pane, a piece of sheet metal, a thin sheet, preferably a thin transparent sheet or the like are each suitable as substrate 7.

Figure 3:
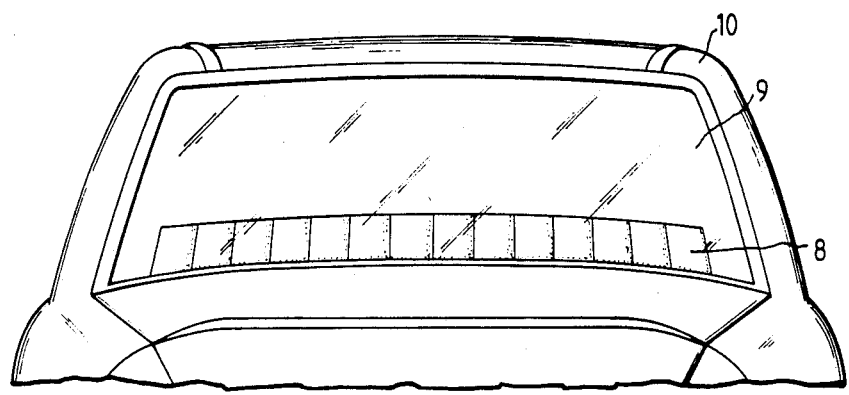
FIG. 3 shows a solar generator which is part of a passenger automobile rear window.

The curved solar generator laminate may be an integral component of a vehicle, for example a passenger vehicle, a truck, a mobile home, or a boat. In addition to use as a sun roof, it can be used, for example, as a spoiler, a vehicle roof, a trunk lid, or a partial component of a vehicle window. The latter example is shown in FIG. 3, where a curved solar generator 8 is a partial component of a vehicle rear window 9. The vehicle roof in this example bears the reference numeral 10.

The invention contemplates adapting the shape of the curved solar generator to the aerodynamic shape of a vehicle. The use of chemically hardened glass panes is also contemplated, which will reduce thickness and weight of the generator.

A curved solar generator can be produced, for example, by preforming substrate 7 and glass pane 4 to correspond to the desired curvature of the laminate. The solar cells 6 and the thermosetting adhesive foils 5 are then inserted between substrate 7 and glass pane 4 with the inserted components being approximately adapted to the curvature of the laminate by external mechanical pressure on substrate 7 and glass pane 4. In a vacuum heating process, melt-adhesive foil 5 and solar cells 6 are adapted in shape to curved substrate 7 and curved glass pane 4 and are bonded to these components to form a curved laminate. It should also be mentioned that the thermosetting adhesive foils 5 form practically a single foil after melting.

Instead of the above-mentioned chemically hardened glass panes 4, glass panes 4 can also be used which are thermally hardened. Instead of glass panes 4, thin transparent sheets may also be used. White glass, that is, glass which exhibits practically no absorption in the range of light waves for which the solar cells are particularly sensitive, is suitable as the glass material. The glass can have for example a low iron content of 0.028%–0.033% and thus a solar light transmission of between 91% and 92%.

If amorphous thin-film solar cells are employed, substrate 7 may be omitted. The frontal glass pane 4 can then serve as support for the at least one-dimensionally bent solar cells 6.

It is understood that various other modifications will be apparent to and can readily be made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A contoured solar generator with associated electrical terminals and connecting lines, comprising:
   a curved laminate composed of solar cells bent in at least one dimension, an elastic thermosetting adhesive foil in which said solar cells are embedded, and a curved glass pane overlaying one face of said elastic thermosetting adhesive foil.

2. The contoured solar generator set forth in claim 1, including a curved substrate overlaying an opposite face of said elastic thermosetting adhesive foil from said face overlaid by said curved glass pane.

3. The contoured solar generator set forth in claim 2, wherein said curved substrate and curved glass pane are thermally preformed and are manufactured in pairs.

4. The contoured solar generator as set forth in claim 3, wherein said curved substrate is a second glass pane.

5. The contoured solar generator as set forth in claim 4, wherein said curved substrate is a second glass pane and said curved laminate forms at least part of a vehicle window.

6. The contoured solar generator as set forth in claim 4, including chemically hardened glass panes.

7. The contoured solar generator as set forth in claim 4, including thermally hardened glass panes.

8. The contoured solar generator as set forth in claim 3, wherein said curved substrate is a sheet metal substrate.

9. The contoured solar generator as set forth in claim 3, wherein said curved substrate is a thin sheet.

10. The contoured solar generator as set forth in claim 9, wherein said curved substrate is a thin transparent sheet.

11. The contoured solar generator as set forth in claim 2 wherein said curved laminate is an integral component of a vehicle.

12. The contoured solar generator as defined in claim 2, wherein said curved laminate is a vehicle sun roof.

13. The contoured solar generator as set forth in claim 2, wherein said curved laminate is a vehicle spoiler.

14. The contoured solar generator as set forth in claim 2, wherein said glass pane is of white glass.

15. A method of producing a solar generator as set forth in claim 2, comprising:
   preforming a substrate and a glass pane to a selected curvature to form a curved pre-laminate;
   inserting solar cells and a thermosetting adhesive foil between said substrate and said glass pane;
   applying external mechanical pressure on said substrate and on said glass pane to adapt said solar cells and thermosetting adhesive foil approximately to the curvature of said pre-laminate; and
   bonding said thermosetting adhesive foil and said solar cells to said curved substrate and said curved glass pane in a hot vacuum process to form a curved laminate.

16. The contoured solar generator as set forth in claim 1, wherein the curved laminate is adapted to the aerodynamic shape of the vehicle.

17. A contoured solar generator, comprising:
   a curved laminate composed of solar cells bent in at least one dimension, an elastic thermosetting adhesive foil in which said bent solar cells are embedded, a curved thin transparent sheet overlaying one face of said elastic thermosetting adhesive foil, and a curved substrate overlaying an opposite face of said elastic thermosetting adhesive foil from said face overlaid by said curved thin transparent sheet.

* * * * *